United States Patent
Wu

(10) Patent No.: US 7,598,585 B2
(45) Date of Patent: Oct. 6, 2009

(54) STRUCTURE FOR PREVENTING LEAKAGE OF A SEMICONDUCTOR DEVICE

(75) Inventor: Chan-Liang Wu, Hsinhua (TW)

(73) Assignee: Himax Technologies Limited, Tainan County (TW)

( * ) Notice: Subject to any disclaimer, the term of this patent is extended or adjusted under 35 U.S.C. 154(b) by 401 days.

(21) Appl. No.: 11/420,198

(22) Filed: May 24, 2006

(65) Prior Publication Data
US 2006/0255430 A1 Nov. 16, 2006

Related U.S. Application Data

(63) Continuation-in-part of application No. 11/206,210, filed on Aug. 18, 2005, now Pat. No. 7,388,266.

(30) Foreign Application Priority Data

| May 12, 2005 | (TW) | ............................. 94115422 A |
| Oct. 20, 2005 | (TW) | ............................. 94136781 A |

(51) Int. Cl.
*H01L 23/58* (2006.01)
*H01L 29/00* (2006.01)
*H01L 23/552* (2006.01)

(52) U.S. Cl. .................. 257/490; 257/488; 257/503; 257/659; 257/E29.012

(58) Field of Classification Search ................ 257/488, 257/490, 503, 659, E29.012
See application file for complete search history.

(56) References Cited

U.S. PATENT DOCUMENTS

| 4,853,759 | A | * | 8/1989 | Haque .................... 257/533 |
| 6,023,095 | A | * | 2/2000 | Hirabayashi ............... 257/659 |
| 6,483,176 | B2 | * | 11/2002 | Noguchi et al. ............. 257/666 |
| 6,504,237 | B2 | * | 1/2003 | Noguchi et al. ............. 257/666 |
| 6,510,545 | B1 | * | 1/2003 | Yee et al. .................... 716/12 |
| 7,084,481 | B2 | * | 8/2006 | Lowther et al. ............. 257/531 |
| 2001/0017418 | A1 | * | 8/2001 | Noguchi et al. ............. 257/758 |
| 2002/0024148 | A1 | * | 2/2002 | Itoh .......................... 257/784 |

* cited by examiner

*Primary Examiner*—Ngan Ngo

(57) ABSTRACT

A structure for preventing leakage of a semiconductor device is provided. The structure comprises a conductive layer, for shielding the features beneath thereof, located under a conductive line which crosses over a region having high voltage device. The conductive layer is wider than the conductive line.

7 Claims, 6 Drawing Sheets

US 7,598,585 B2

STRUCTURE FOR PREVENTING LEAKAGE OF A SEMICONDUCTOR DEVICE

RELATED APPLICATIONS

The present application is a continuation-in-part of U.S. application Ser. No. 11/206,210, filed on Aug. 18, 2005, which claims priority from Taiwanese Application Serial Number 94115422, filed May 12, 2005, the disclosure of which are hereby incorporated by reference herein in their entirety.

This application claims Priority of Taiwanese Application Serial Number 94136781, filed Oct. 20, 2005, the disclosure of which is hereby incorporated by reference herein its entirety.

BACKGROUND OF THE INVENTION

1. Field of Invention

The present invention relates to a structure for preventing leakage of a semiconductor device. More particularly, the present invention relates to a structure for prevention of a parasitic transistor, which exists in a region including at least one semiconductor device, from causing leakage of the semiconductor device.

2. Description of Related Art

Typically, integrated circuits (ICs) operate at various operating voltages. Therefore, transistors in these ICs must withstand certain voltage thresholds. For example, transistors with gate lengths of less than 0.25 μm typically operate at less than 2.5 volts, while transistors with longer gate length (>0.3 μm) may operate at well over 3 volts. In certain high voltage applications such as power supplies and hard-disk controllers, even higher operating voltage ranging from 6 volts to 35 volts may be required.

There is at least one insulation layer, which is used to insulate the conductive lines and the active region above the high voltage devices, however, the high operating voltage also affects the active region. If the conductive line crosses over two separated doped regions of the active region, a parasitic transistor might be constructed. The parasitic transistor will cause leakage of the doped regions, and the performance of the devices containing the doped regions decreases. Hereby a pair of N-type high voltage transistors is used as an example to describe the reasons for forming parasitic transistor. The parasitic transistor also occurs between a pair of P-type high voltage transistors, and between a transistor and a doped region.

FIG. 1 is a schematic, cross-sectional view of a pair of the traditional N-type high voltage transistors. P-type wells 102, 104, 106 and N-type wells 108, 110 are located on a substrate 100. The shallow trench isolation (STI) structures 112, 114, 116, 118, 120 and 122 are respectively located in the P-type well 102, between P-type well 102 and N-type well 108, in N-type well 108, between N-type well 108 and P-type well 104, between P-type well 104 and N-type well 110, in the N-type well 110, and in the P-type well 106.

With further reference to FIG. 1, high voltage transistors 10 and 20 are formed on the substrate 100. The transistor 10 has a source 12, a drain 14 and a gate 16. The source 12 is located in the P-type well 102 and at the right side of the STI 112. The drain 14 is located in the N-type well 108 and between STI 114 and 116. The gate 16 is located on the surface of the substrate 100 and crosses over P-type well 102, N-type well 108 and STI 114. The transistor 20 has a source 22, a drain 24 and a gate 26. The source 22 is located in the P-type well 106 and at the left side of the STI 120. The drain 24 is located in the N-type well 110 and between STI 118 and 120. The gate 26 is located on the surface of the substrate 100 and crosses over P-type well 106, N-type well 110 and STI 120. A guard ring 124 is located in the substrate 100 and surrounds the structures disclosed above. An insulation layer 126 blankets all features located on the substrate 100 and a conductive line 128 is located on the insulation layer 126. The conductive line 128 crosses over the position above the P-type well 104. Besides, another conductive line (not shown) also can be formed on the conductive line 128, and the two conductive lines are isolated by another insulation layer (not shown).

FIG. 2 is a schematic, top view of the device in FIG. 1. The structures inside the circle 140 consist a parasitic transistor, in which the conductive line 128 is a parasitic gate, the drain 14 of transistor 10 and N-type well 104 are one of the parasitic source/drain, the drain 24 of transistor 20 and N-type well 110 are another parasitic source/drain, and the P-type well 104 is the parasitic channel region. The parasitic transistor could be turned on while a current flows through the conductive line 128 and the leakage form the transistors 10 and 20 will occur.

The parasitic transistor does not only exist between two high voltage transistors, but also exist when a conductive line crosses over a region between a high voltage transistor and the guard ring. FIG. 3 is a schematic, top view of a high voltage transistor. A N(or P)-type well 34 is located between a source/drain 30 and a guard ring 32. When a conductive line 36 crosses over the N(or P)-type well 34, the structures inside the circle 340, the conductive line 36, the source/drain 30 and the guard ring 32, consist a parasitic transistor. Therefore, if the conductive lines, located at the upper layer, cross over the N/P-type well or active region on the substrate, parasitic transistors may be constructed.

The parasitic transistor will be turned on when a current flows through the conductive line. The performance of the high voltage transistor decreases due to the leakage caused by switching on of the parasitic transistor. Therefore, avoiding the effect of the parasitic transistor is an important subject.

SUMMARY OF THE INVENTION

Due to the parasitic transistor is an important factor to cause the leakage of the semiconductor device, such as a high voltage device. Therefore, the design of the high voltage structure to prevent the leakage of the high voltage device is necessary.

It is therefore an aspect of the present invention to provide a structure for preventing leakage of a semiconductor device, such as a high voltage device. The structure prohibits the parasitic transistor from switching on. Moreover, it is not necessary to alter the processes for forming the high voltage device when the structure is inducted into the high voltage device. The cost of forming the high voltage device doesn't increase.

In accordance with the foregoing and other aspects of the present invention, a conductive layer is embedded under the conductive lines and beneath the high voltage transistors. The conductive layer is connected to a reference voltage, such as ground, and is used as a shielding layer. The conductive layer screens the conductive lines and prevents the high voltage device form the effect of the electric charge carried on the conductive line.

A pair of high voltage transistors on a substrate of an embodiment of the present exemplifies the structural relationship between the conductive layer and other structures. Two first type, such as P-type, transistors which are separated with a second type, such as N-type, well are on a substrate. A guard ring is on the substrate and surrounds the transistors. A first insulation layer covers the transistors, the second type well and the guard ring. A second insulation layer is formed on the first insulation layer. At least one conductive line lies on the second insulation layer and a conductive layer is located between the first and the second insulation layer and under the conductive line. The conductive layer at least shields a portion of the region surrounded by the guard ring. The conductive layer electrically connects to a structure, such as the guard ring. Generally, a reference voltage, such as ground is provided to the structure. Besides, the first type transistors can be N-type transistor but the second type well must be P-type well when the first type transistor is N-type transistor.

The conductive layer provides a shield to the region underneath. The width of the conductive layer is wider than the conductive line overhead, the conductive layer is preferred about the same width as the region needed being shielded, more preferred the conductive layer is wider than the region needed being shielded to get better shielding effect. Because the conductive layer is located under the conductive lines, the conductive layer shields the region underneath from the effect of the electric charge carried on the conductive line. Although there is a parasitic transistor structure on the substrate, but the parasitic transistor can't be turned on.

According another preferred embodiment, a first type, such as P-type, transistors is located on a second type, such as N-type, well, which is surrounded by a guard ring on a substrate. A first insulation layer covers the transistors, the second type well and the guard ring. A second insulation layer is formed on the first insulation layer. At least one conductive line lies on the second insulation layer and a conductive layer is located between the first and the second insulation layer and underneath the conductive line. The conductive layer at least shields a portion of the region surrounded by the guard ring. The conductive layer is connected to a reference voltage, such as ground, and is used as a shielding layer.

Similarly, a parasitic transistor consists of conductive lines, portion of the guard ring and a source/drain of the first type transistor can't be turned on because the conductive layer underneath the conductive lines screens the effect of the electric charge carried on the conductive lines.

According to another preferred embodiment of the present invention, a conductive layer is located on the substrate. The conductive layer is simultaneously formed, by the process for forming gate of the high voltage transistors, on the N or P doped well between two high voltage transistors or between a transistor and a guard ring. The conductive layer is electrically connected to a structure, such as the guard ring. Generally, a reference voltage, such as ground, is provided to the structure. A first dielectric layer is formed and covers all structures on the substrate. Conductive lines are formed on the first dielectric layer and located above the conductive layer. A parasitic transistor consists of conductive lines, portion of the guard ring and a source/drain of the first type transistor or source/drains of the adjacent two first type transistors will not be turned on because the conductive layer underneath the conductive lines screens the effect of the electric charge carried on the conductive lines.

Using of the structure disclosed in the present invention can prevent leakage of a high voltage device. The parasitic transistor structure still exists on the substrate, but the voltage carried on the conductive line (the gate of the parasitic transistor) can't turn on the parasitic transistor. Therefore, the leakage caused by the parasitic transistor can be avoided. Moreover, only one additional step for forming the conductive layer on the first dielectric layer is provided, the original processes for forming the high voltage device does not change when the conductive layer is inducted into the high voltage device. The cost of forming the high voltage device doesn't increase.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

The invention can be more fully understood by reading the following detailed description of the preferred embodiment, with reference made to the accompanying drawings as follows.

DESCRIPTION OF THE PREFERRED EMBODIMENTS

Figure 1:
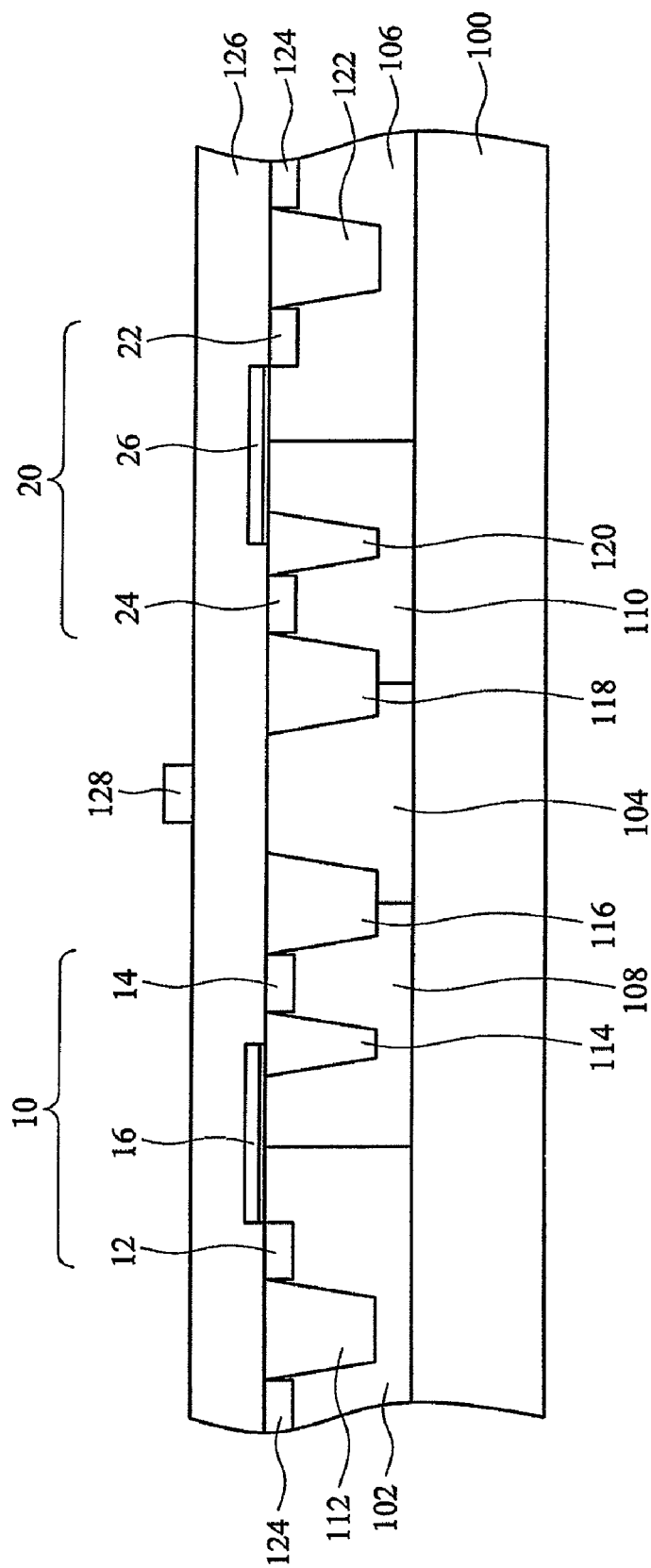
FIG. 1 is schematic, cross-sectional view of a pair of the traditional N-type high voltage transistors.
Figure 2:
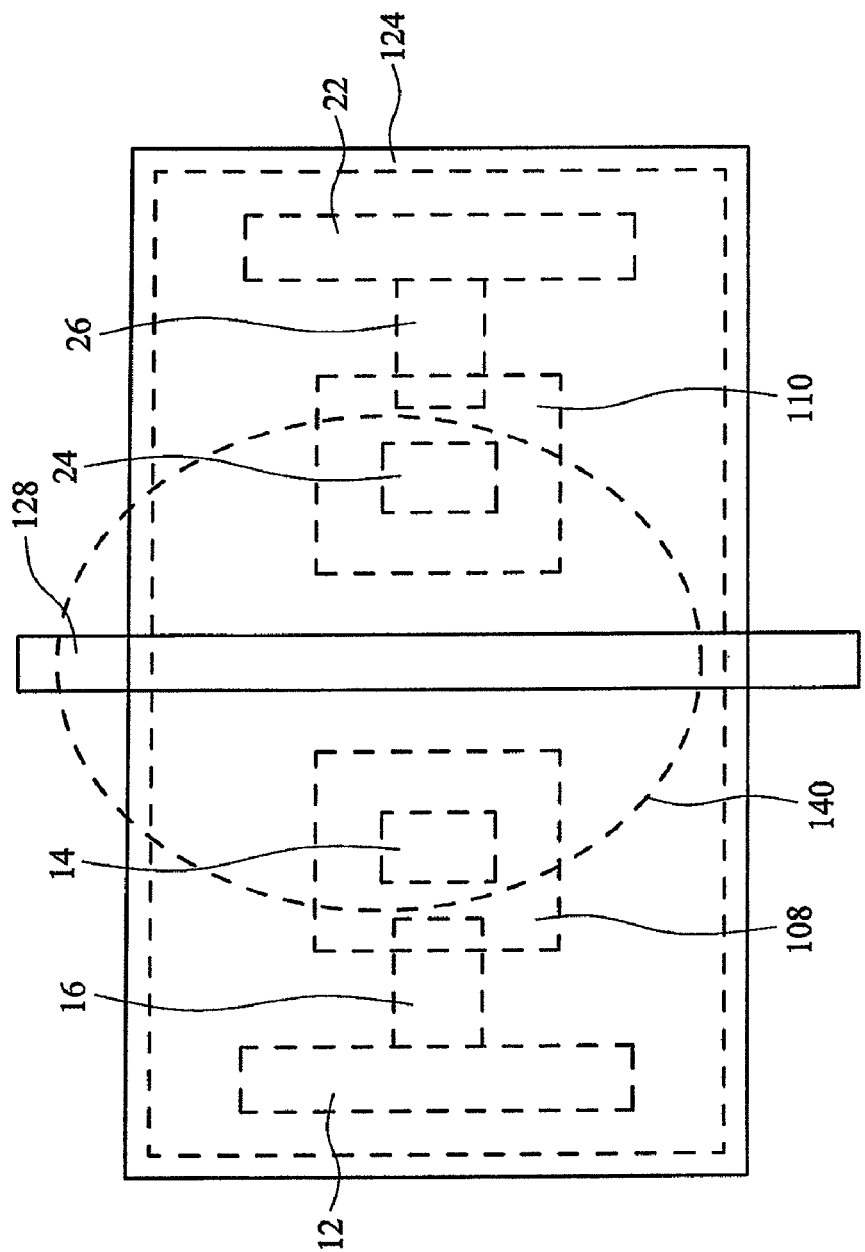
FIG. 2 is a schematic, top view of FIG. 1.
Figure 3:
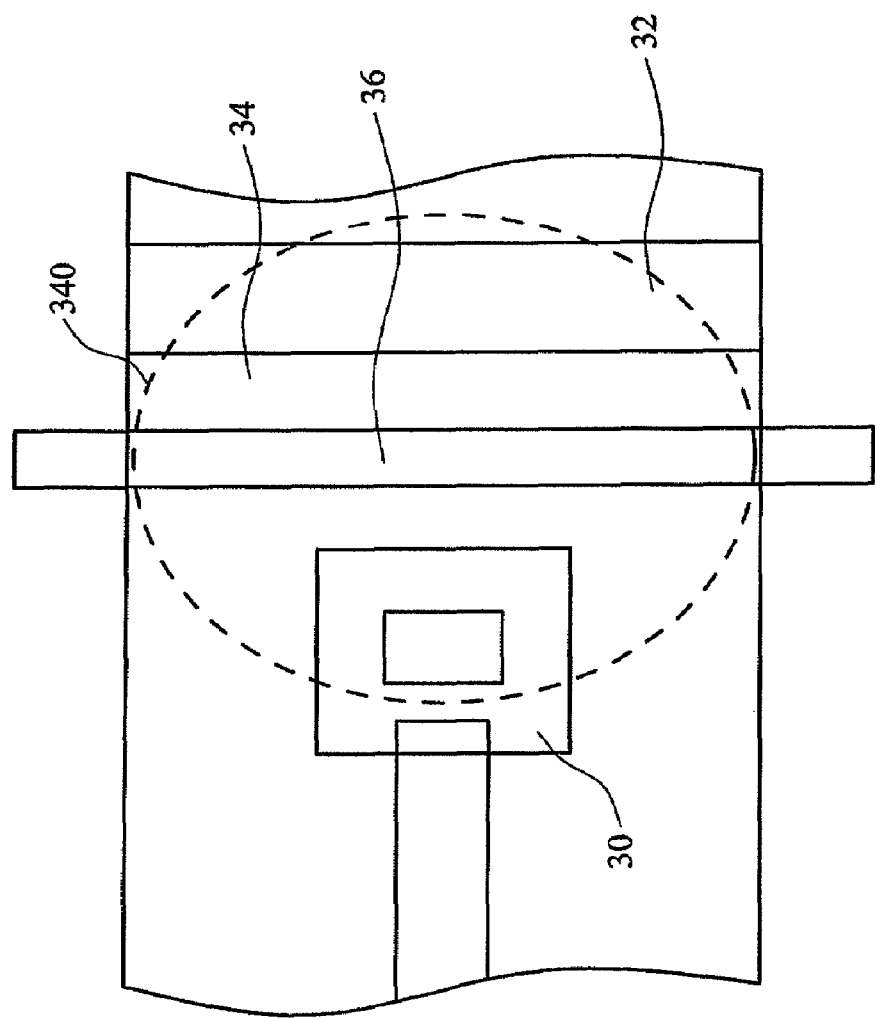
FIG. 3 is a schematic, top view of a high voltage transistor.

Reference will now be made in detail to the present preferred embodiments of the invention, examples of which are illustrated in the accompanying drawings. Wherever possible, the same reference numbers are used in the drawings and the description to refer to the same or like parts.

Figure 4:
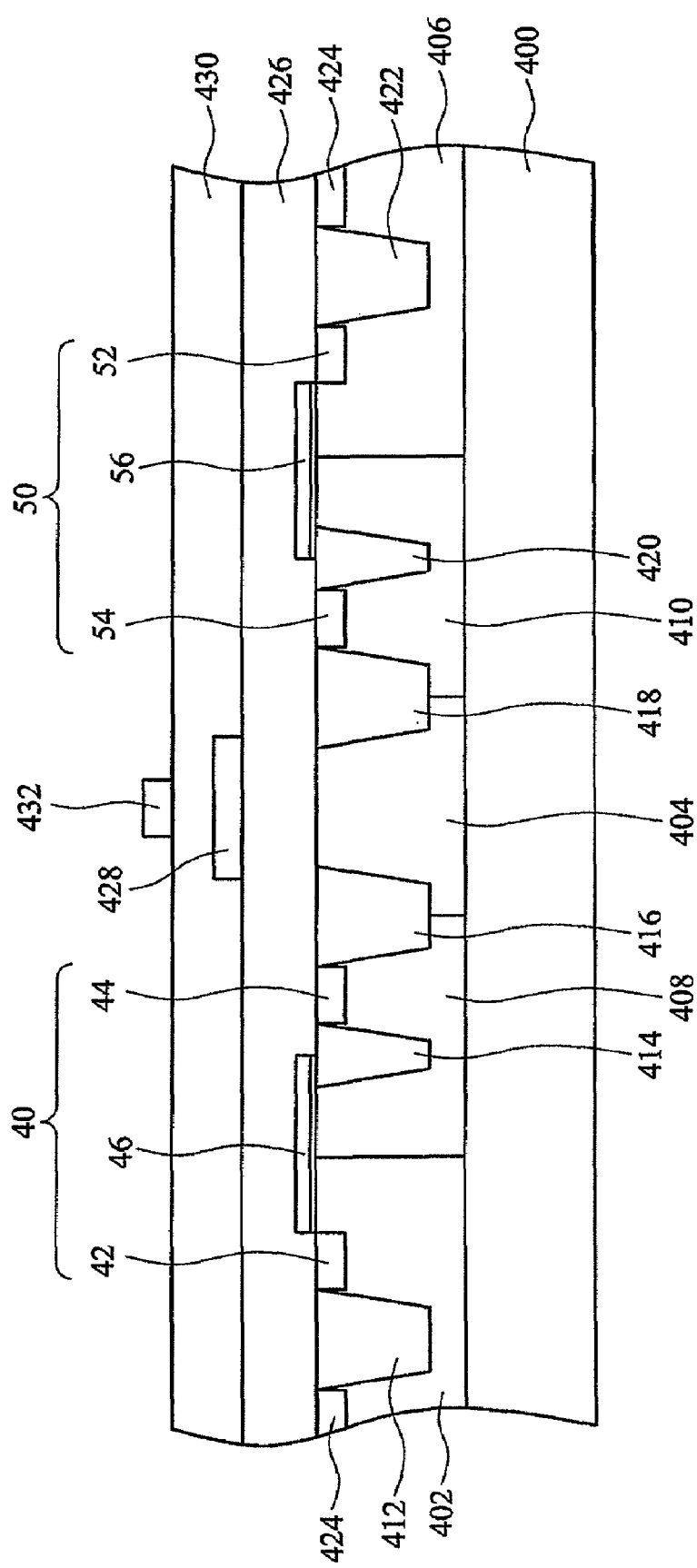
FIG. 4 is a schematic, cross-sectional view of a pair of N-type high voltage transistors of the first preferred embodiment of the present invention.

FIG. 4 is a schematic, cross-sectional view of a pair of N-type high voltage transistors according to a preferred embodiment of the present invention. P-type wells 402, 404, 406 and N-type wells 408, 410 are located on a substrate 400. The shallow trench isolation (STI) structures 412, 414, 416, 418, 420 and 422 are respectively located in the P-type well 402, between P-type well 402 and N-type well 408, in N-type well 408, between N-type well 408 and P-type well 404, between P-type well 404 and N-type well 410, in the N-type well 410, and in the P-type well 406.

With further reference to FIG. 4, high voltage transistors 40 and 50 are formed on the substrate 400. The transistor 40 has a source 42, a drain 44 and a gate 46. The source 42 is located in the P-type well 402 and at the right side of the STI 412. The drain 44 is located in the N-type well 408 and between STI 414 and 416. The gate 46 is located on the surface of the substrate 400 and crosses over P-type well 402, N-type well 408 and STI 414. The transistor 50 has a source 52, a drain 54 and a gate 56. The source 52 is located in the P-type well 406 and at the left side of the STI 420. The drain 54 is located in the N-type well 410 and between STI 418 and 420. The gate 56 is located on the surface of the substrate 100 and crosses over P-type well 406, N-type well 410 and STI 420. A guard ring 424 is located in the substrate 400 and surrounds the structures disclosed above. The guard ring 424 is formed by an implantation process or a silicide process.

An insulation layer 426 blankets all features located on the substrate 400 and a conductive layer is formed on the insulation layer 426. The conductive layer 428 is also above the P-type well 404. Thereafter, an insulation layer 430 is formed and covers the conductive layer 428 and the insulation layer 426. A conductive line 432 is located on the insulation layer 426. The conductive line 432 also crosses over the P-type well 404 and the conductive layer 428. Besides, another conductive line (not shown) also can be formed on the conductive line 432, and the two conductive lines are isolated by another insulation layer (not shown). For the purpose of providing enough shielding to the region underneath, the width of the conductive layer 428 is wider than the conductive line 432 thereupon. The width of conductive layer 428 is preferably the same as or wider than that of the region, P-type well 404. The conductive layer 428 is made of metal, doped polysilicon, metal silicide or their combination. The insulation layers 426 and 430 are made of silicon oxide, silicon nitride or silicon oxynitride.

The conductive layer 428 is electrically connected to the guard ring 424. Generally, a reference voltage, such as ground, is provided to the guard ring 424. Therefore, the conductive layer 428 provide a perfect shielding effect to the P-type well 404.

Figure 5:
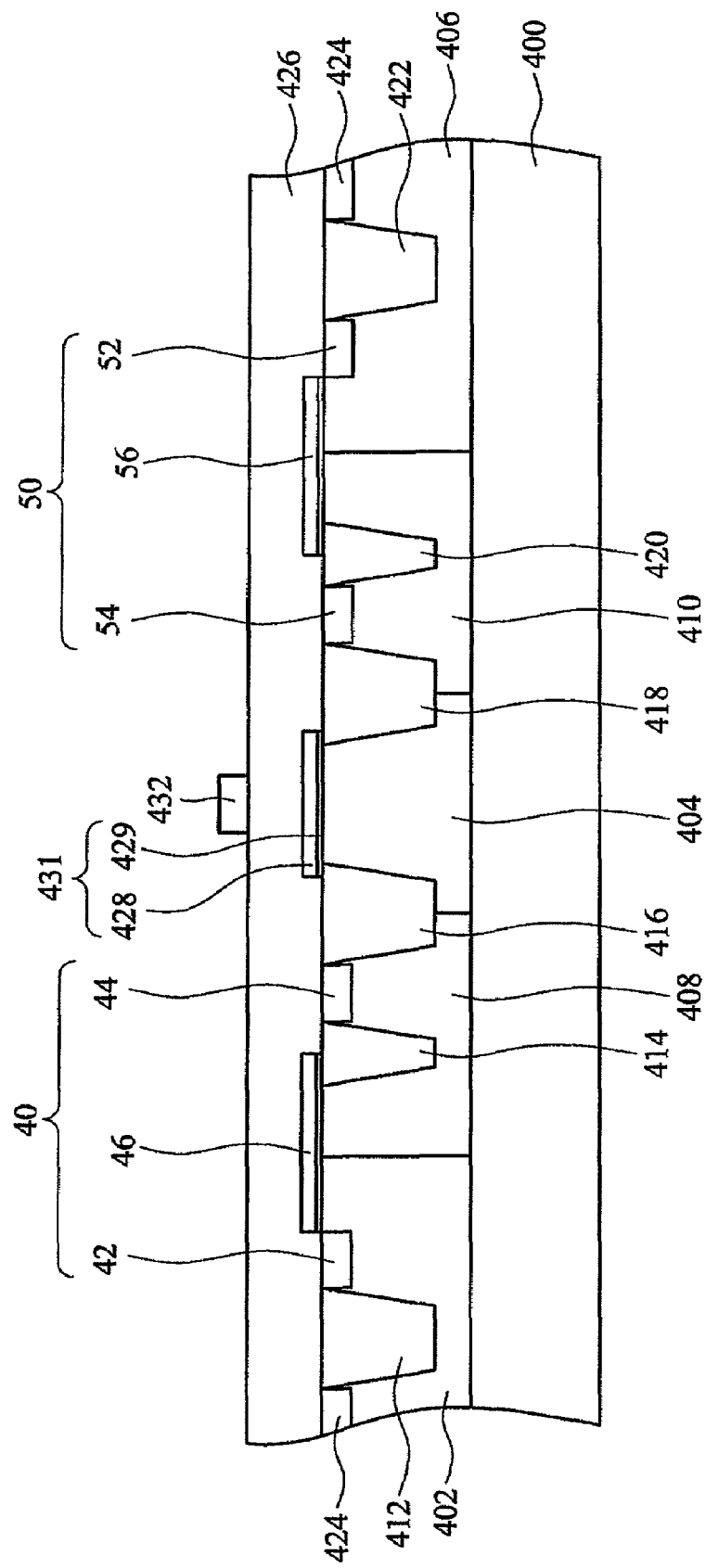
FIG. 5 is a schematic, cross-sectional view of a pair of N-type high voltage transistors of the second preferred embodiment of the present invention.

FIG. 5 is a schematic, top view of a structure preventing high voltage transistor from leakage in the second preferred embodiment of the present invention. The structure illustrated in FIG. 5 is similar with the structure in FIG. 4 except that the conductive layer 428 in FIG. 5 is directly located on the P-type well 404, that the conductive line 432 in FIG. 5 is located on the insulation layer 426; and that there is no insulation layer 430 in FIG. 5. The same elements in FIGS. 4 and 5 refer to the same symbol for clarity.

The conductive layer 428 may be simultaneously formed when the process for forming gates 46 and 56 of the high voltage transistors is performed. Besides, the conductive layer 428 is also made of other conductive material, such as metal. The conductive layer 428 and P-type well 404 are insulated by the insulation layer 429 located therebetween. The insulation layer 429 may be simultaneously formed when the process for forming the gate dielectric of the gates 46 and 56 of the high voltage transistors is performed. Besides, the insulation layer 429 is also made of other insulation material, such as silicon oxide or silicon nitride. A shielding layer 431 is composed of the conductive layer 428 and the insulation layer 429.

Thereafter, an insulation layer 426 is formed and covers the structures on the substrate. A conductive line 432 is located on the insulation layer 426 and above the conductive layer 428. Generally, an insulation layer (not shown) could be formed and cover the conductive line 432 and another conductive line (not shown) also can be formed on the insulation layer. For the purpose of providing enough shielding to the region, P-type well 404, underneath, the width of the conductive layer 428 is wider than the conductive line 432 thereupon.

The conductive line 432 also crosses over the P-type well 404 and the conductive layer 428. The conductive layer 428 is preferably across between the STI structures 416 and 418 but is not beyond the left side of the STI structure 416 and right side of STI structure 418 for effectively shielding the P-type well 404. The conductive layer 428 is made of metal, doped polysilicon, metal silicide or their combination. The insulation layers 426 and 430 are made of silicon oxide, silicon nitride or silicon oxynitride.

The conductive layer 428 is electrically connected to the guard ring 424. Generally, a reference voltage, such as ground, is provided to the guard ring 424. Therefore, the conductive layer 428 provides a perfect shielding effect to the P-type well 404.

Figure 6:
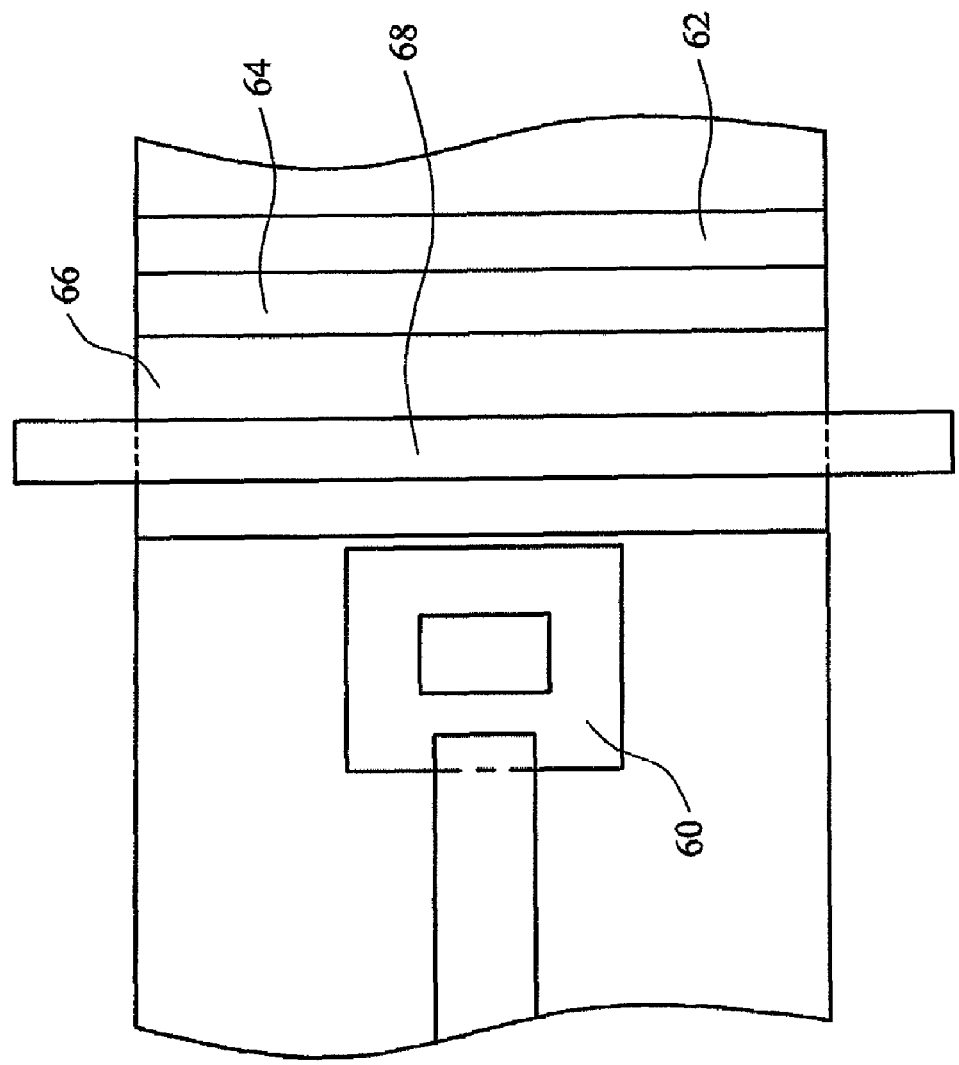
FIG. 6 is a schematic, top view of a structure preventing high voltage transistor from leakage in the third preferred embodiment of the present invention.

FIG. 6 is a schematic, top view of a structure preventing high voltage transistor from leakage in the third preferred embodiment of the present invention. A N-type (or P-type) well 64 is located between a source/drain 60 of the high voltage transistor and a guard ring 62. A conductive line 68 crosses over the N(or P)-type well 64 and a conductive layer 66 is located between the N-type (or P-type) well 64 and the conductive line 68. Two insulation layers are respectively located between the conductive line 68 and conductive layer 66, and between conductive layer 66 and N-type (or P-type) well 64. The width of the conductive layer 66 is wider than the conductive line 68 overhead for providing enough shielding effect to the N-type (or P-type) well 64 underneath. The conductive layer 66 is made of metal, doped polysilicon, metal silicide or their combination. The insulation layers 426 and 430 are made of silicon oxide, silicon nitride or silicon oxynitride.

The conductive layer 66 is electrically connected to the guard ring 62. Generally, a reference voltage, such as ground, is provided to the guard ring 62. Therefore, the conductive layer 66 provide a perfect shielding effect to the P-type well 64.

According to the above description, adoption of the structure disclosed in the present invention prevents leakage of a high voltage device. Although the parasitic transistor structure still exists on the substrate, the voltage carried on the conductive line (the gate of the parasitic transistor) does not turn on the parasitic transistor. Therefore, the leakage caused by the parasitic transistor is avoided. Moreover, only one additional step for forming the conductive layer on the first dielectric layer is provided. There is no need for modification of the manufacture processes of the high voltage device, which does not cause an increase of the cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure for preventing leakage of a semiconductor device, comprising:
   a high-voltage semiconductor device on a substrate;
   a guard ring on the substrate and surrounding the high-voltage semiconductor device;
   a conductive line above the substrate and crossing over a region between the high-voltage semiconductor device and the guard ring; and
   a shielding line above the region and between the conductive line and the substrate for shielding the high-voltage semiconductor device from the conductive line to prevent leakage of the high-voltage semiconductor, wherein the shielding line is wider than the conductive line.

2. The structure of claim 1, wherein the shielding line comprises a conductive layer connecting to a reference voltage.

3. The structure of claim 2, wherein the conductive layer comprises a material selected from a group consisting of metal, doped polysilicon, silicide and the combination thereof.

4. The structure of claim 1, wherein the high-voltage semiconductor device comprises a high-voltage transistor.

5. The structure of claim 1, further comprising a first insulating layer between the high-voltage semiconductor device and the shielding line.

6. The structure of claim 1, further comprising a second insulating layer between the conducting line and the shielding line.

7. The structure of claim 1, further comprising a doped well located on the substrate and between the high-voltage semiconductor device and the guard ring.

* * * * *